(12) United States Patent
Martin et al.

(10) Patent No.: US 8,776,868 B2
(45) Date of Patent: Jul. 15, 2014

(54) THERMAL GROUND PLANE FOR COOLING A COMPUTER

(75) Inventors: Yves Martin, Yorktown Heights, NY (US); Theodore G. Van Kessel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1356 days.

(21) Appl. No.: 12/550,090

(22) Filed: Aug. 28, 2009

(65) Prior Publication Data

US 2011/0048672 A1 Mar. 3, 2011

(51) Int. Cl.
F28F 7/00 (2006.01)

(52) U.S. Cl.
USPC ........... 165/46; 165/80.2; 165/80.4; 165/80.5

(58) Field of Classification Search
USPC ............................ 165/46, 80.2, 80.4, 80.5, 83
See application file for complete search history.

(56) References Cited

U.S. PATENT DOCUMENTS

| 4,580,619 | A | * | 4/1986 | Aitken | 165/46 |
|---|---|---|---|---|---|
| 4,938,279 | A | * | 7/1990 | Betker | 165/46 |
| 5,245,508 | A | * | 9/1993 | Mizzi | 361/694 |
| 5,322,719 | A | * | 6/1994 | Westling et al. | 428/34.1 |
| 5,370,178 | A | | 12/1994 | Agonafer et al. | |
| 5,608,610 | A | * | 3/1997 | Brzezinski | 361/704 |
| 5,685,363 | A | * | 11/1997 | Orihira et al. | 165/46 |
| 5,740,018 | A | * | 4/1998 | Rumbut, Jr. | 361/720 |
| 5,991,155 | A | * | 11/1999 | Kobayashi et al. | 361/705 |
| 6,062,299 | A | * | 5/2000 | Choo et al. | 165/46 |
| 6,154,363 | A | * | 11/2000 | Chang | 361/699 |
| 6,166,907 | A | * | 12/2000 | Chien | 361/699 |
| 6,216,771 | B1 | * | 4/2001 | Holmberg et al. | 165/46 |
| 6,230,788 | B1 | * | 5/2001 | Choo et al. | 165/46 |
| 6,282,913 | B1 | * | 9/2001 | Moriguchi et al. | 62/259.2 |
| 6,504,720 | B2 | * | 1/2003 | Furuya | 361/699 |
| 6,622,782 | B2 | * | 9/2003 | Malhammar | 165/46 |
| 6,690,578 | B2 | * | 2/2004 | Edelmann | 361/699 |
| 6,865,077 | B2 | * | 3/2005 | Igarashi | 361/679.21 |
| 6,904,956 | B2 | * | 6/2005 | Noel | 165/10 |
| 7,007,741 | B2 | * | 3/2006 | Sen et al. | 165/46 |
| 7,055,575 | B2 | * | 6/2006 | Noel | 165/10 |
| 7,063,127 | B2 | * | 6/2006 | Gelorme et al. | 165/80.2 |
| 7,167,366 | B2 | * | 1/2007 | Cheon | 361/699 |
| 7,312,987 | B1 | * | 12/2007 | Konshak | 361/679.48 |
| 7,626,815 | B2 | * | 12/2009 | Stefanoski | 361/679.47 |
| 7,770,809 | B2 | * | 8/2010 | Vafai et al. | 236/93 R |
| 7,952,873 | B2 | * | 5/2011 | Glahn et al. | 361/699 |
| 7,995,344 | B2 | * | 8/2011 | Dando et al. | 361/710 |
| 8,000,103 | B2 | * | 8/2011 | Lipp et al. | 361/702 |

(Continued)

FOREIGN PATENT DOCUMENTS

| JP | 2006127445 A2 | 5/2006 |
|---|---|---|
| JP | 2006302223 A2 | 11/2006 |

Primary Examiner — Marc Norman
Assistant Examiner — Devon Russell
(74) Attorney, Agent, or Firm — Michael J. Buchenhorner; Vazken Alexanian

(57) ABSTRACT

A cooling device for cooling a computer includes: a flexible and conformal fluid heat-exchanger coupled to a surface of the computer; a liquid coolant material circulated through the fluid heat-exchanger to convey heat from the fluid to an external cooling apparatus; an enclosure defined when the fluid heat-exchanger is placed against the computer surface; and a vacuum applied to the enclosure, removably sealing the fluid heat-exchanger to the computer to provide a vapor seal for the enclosure.

10 Claims, 4 Drawing Sheets

Method for connecting a computer to a thermal ground plane

Partial vacuum between water sleeve and computer provides a good mechanical and thermal contact over a large area

(56) References Cited

U.S. PATENT DOCUMENTS

| | | |
|---|---|---|
| 8,215,377 B1 * | 7/2012 | Monson et al. ............. 165/46 |
| 8,441,792 B2 * | 5/2013 | Dunwoody et al. ......... 361/699 |
| 8,448,693 B2 * | 5/2013 | Lundell et al. ............. 165/46 |
| 2002/0088605 A1 * | 7/2002 | Malhammar ............. 165/46 |
| 2002/0105783 A1 * | 8/2002 | Kitahara ............. 361/695 |
| 2003/0150605 A1 * | 8/2003 | Belady et al. ............. 165/185 |
| 2004/0074630 A1 * | 4/2004 | Sen et al. ............. 165/46 |
| 2004/0190255 A1 * | 9/2004 | Cheon ............. 361/699 |
| 2005/0039879 A1 * | 2/2005 | Hanai ............. 165/46 |
| 2005/0039884 A1 * | 2/2005 | Pawlenko et al. ............. 165/80.4 |
| 2008/0225484 A1 * | 9/2008 | Brodsky et al. ............. 361/699 |

\* cited by examiner

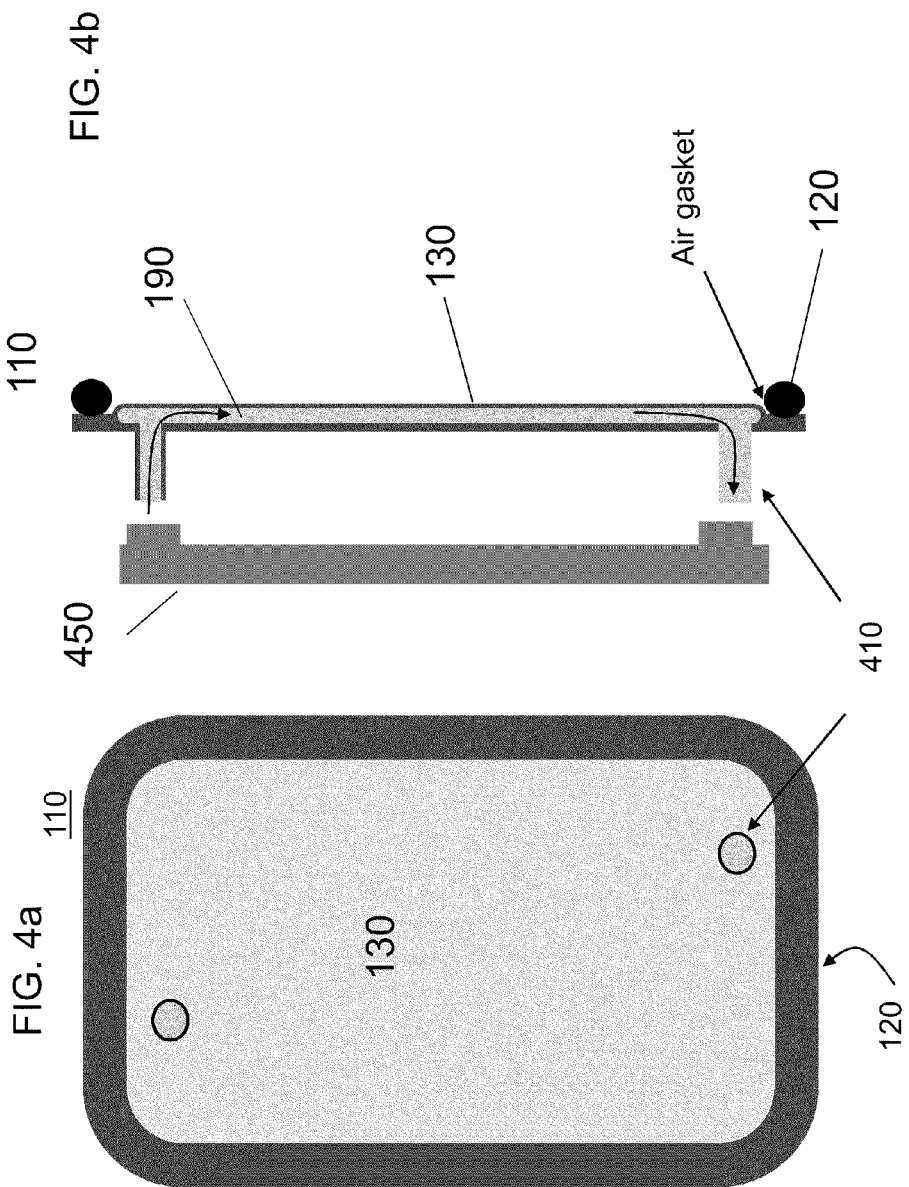

THERMAL GROUND PLANE FOR COOLING A COMPUTER

CROSS-REFERENCE TO RELATED APPLICATIONS

None.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of microprocessor chip cooling and more particularly relates to the field of water cooling.

BACKGROUND OF THE INVENTION

The evolution towards high power microprocessor chips has driven an increased interest in water cooling. Water cooling allows both high performance and energy-efficient computing. However, bringing water inside a computer has many drawbacks, including: 1) a risk of leaks, and therefore of computer down-time or failure. The risk increases when the number of water connections and couplings is large, which is the case in a multi-processor server; 2) difficult rework, servicing and upgrade of the server, due to the added complexity of the water connections; and 3) high cost. Some of the high cost is due to the larger number of costly no-drip water connectors.

There is a need for a cooling method that affords the advantages of water cooling without the above-stated drawbacks.

SUMMARY OF THE INVENTION

Briefly, according to an embodiment of the invention a cooling device for cooling a computer includes: a flexible and conformal fluid heat-exchanger coupled to a surface of the computer; a liquid coolant material circulated through the fluid heat-exchanger to convey heat from the fluid to an external cooling apparatus; an enclosure defined when the fluid heat-exchanger is coupled with the computer surface; and a vacuum applied to the enclosure for removably sealing the fluid heat-exchanger to the computer surface.

The heat-exchanger includes a flexible and conformal fluid-cooling sleeve for containing a liquid coolant material, with a thin flexible non-permeable membrane for coupling with the surface of the electronic device. The heat-exchanger also includes a gasket around the fluid-cooling sleeve to provide a gas seal between the fluid-cooling sleeve and the electronic device surface when the sleeve is coupled with the electronic device surface.

Briefly, according to an embodiment of the present invention, we disclose a method for cooling a computer including steps of: using thermal couplings for conveying heat from powered components of the electronic system to a surface of the electronic system; coupling a flexible and conformal fluid heat-exchanger to the electronic system surface by applying a vacuum between said heat-exchanger and said electronic system surface; and circulating fluid through the heat-exchanger to convey heat from the fluid to an external cooling apparatus.

The method also includes affixing a gasket along the edges of the heat-exchanger. The method further includes a way to provide a partial vacuum between the thermal ground plane and the computer, and some surface treatment of the connecting side(s) to enhance thermal conductivity.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 4a shows the front perspective view of the water sleeve of FIG. 1a, according to an embodiment of the present invention; and FIG. 4b shows a side view of the water sleeve of FIG. 1a, indicating the inlet and outlet ports, according to an embodiment of the present invention.

Figure 1:
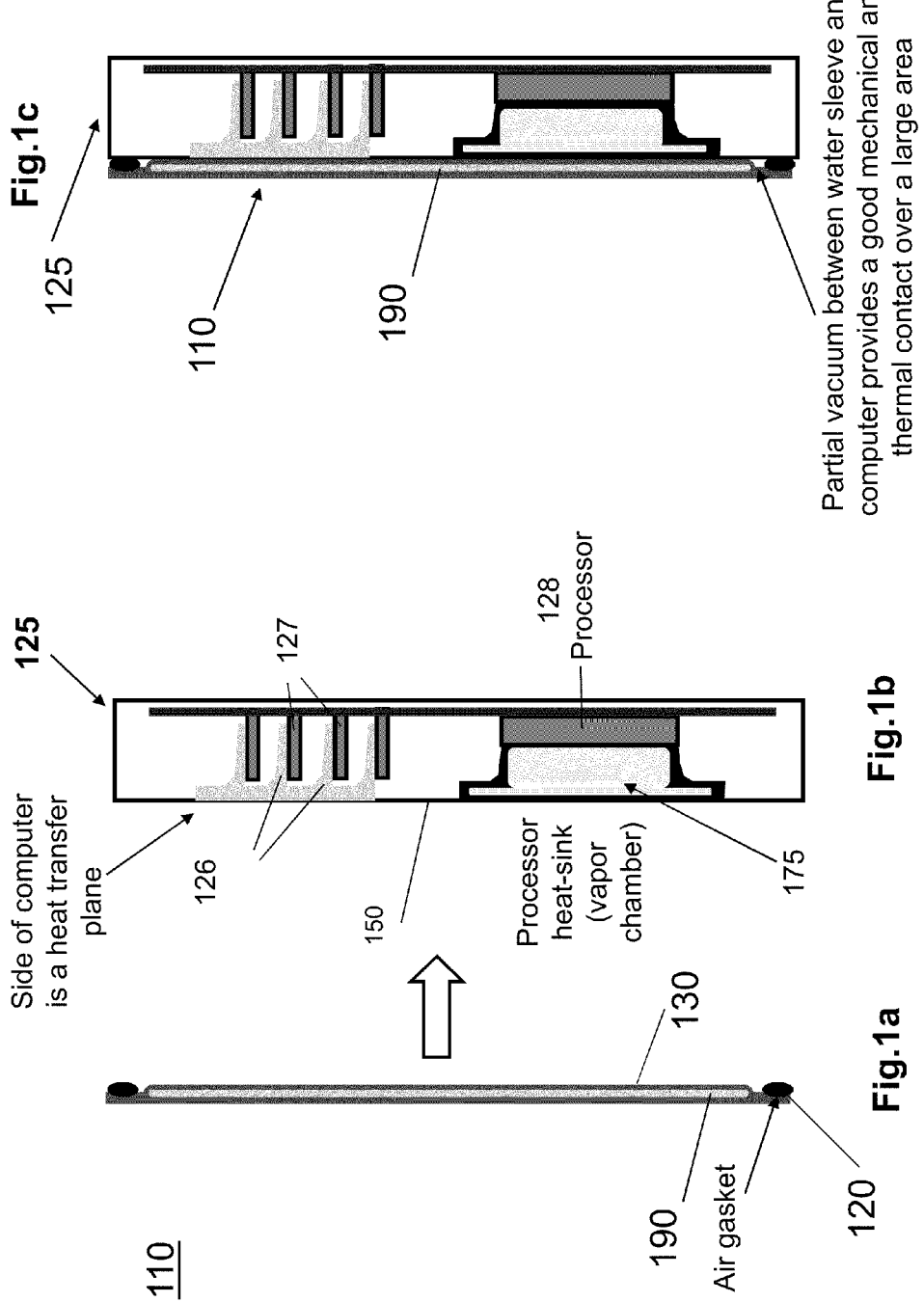
FIG. 1a shows a side view of the water sleeve, according to an embodiment of the present invention.
FIG. 1b shows a cross-sectional view of a computer, according to an embodiment of the present invention.
FIG. 1c shows a cross-sectional view of the computer of FIG. 1b coupled with the water sleeve of FIG. 1a, according to an embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We describe a method for cooling a computer by connecting a heat-transfer plane of a computer to a thermal ground plane, where the thermal ground plane is cooled by a liquid coolant. The thermal ground plane as described herein provides the advantages of water cooling while maintaining most of the water circuitry and complexity outside of the computer enclosure; thereby reducing or eliminating the drawbacks of water cooling, as previously discussed.

Water cooling is efficient and the heat generated in the computer can be primarily evacuated through the water. Because of the high efficiency of heat-spreading of vapor chambers or of heat-pipes, the concentrated heat of processors is spread over a large area (the heat-transfer plane). This way, only a small temperature drop occurs (1° to 10° C.) between the computer heat-transfer plane and the water sleeve. Compared to air cooled operation, the processor temperature is lowered more with water cooling.

By providing water cooling in a removable sleeve outside of the computer, we reduce the risk of computer down time or failure. The water circuit is primarily kept outside of the computer enclosure. Furthermore, the complexity of the water path is reduced, with few or no water connectors. The water sleeve as described provides for easy maintenance and upgrade, especially for blade servers. Because the water-cooling sleeve is so easily disengaged from the blade server, a blade can be plugged in and out without having to break any water connection. The removable sleeve is easily attached and removed from the computer by applying and removing a vacuum.

According to an embodiment of the present invention, a connecting side of the thermal ground plane is a thin, flexible, non-permeable membrane for holding and circulating a liquid coolant such as water or a refrigerant. A partial vacuum is applied between the thermal ground plane and the computer to secure the thermal ground plane to the heat transfer plane. Surface treatments can be applied to the connecting sides to enhance thermal conductivity.

Referring now to the drawings and to FIG. 1a in particular, we show one embodiment of the present invention wherein one or more thin sleeves 110 (shown in a side view) are filled with a liquid coolant such as running water 190 and act as a thermal ground plane. Note that other liquid coolants can also be advantageously used within the spirit and scope of the invention, such as water with antifreeze additives like glycol. The liquid coolant is inserted into the sleeve 110 through an inlet connection (a port or pipe connection) and runs continuously through the sleeve 110 and out through an outlet. Further, when filling the sleeve 110 it is preferable not to overfill, but rather to provide enough coolant 190 for cooling purposes, but not so much that the sleeve 110 is stretched taut to the point where it is unable to deform when filled.

The surface of the sleeve 110 that comes into contact with the computer is made out of a thin and flexible (preferentially) metallic sheet or membrane 130 (0.1 to 0.5 mm thick). The membrane 130 can be made from thin copper, nickel, aluminum or stainless sheets, as well as polymer sheet (PVC, polyimide . . . ). A gasket 120 (possibly made out of silicone rubber), shown in cross-section here, is provided along a perimeter of the sleeve 110.

FIG. 1a shows the water sleeve 110 and FIG. 1b shows the computer 125. FIG. 1c shows the two assembled together, with a partial vacuum applied between the two. Referring now to FIG. 1b, in order to be applicable to computer cooling, one side of a computer enclosure 125 is made relatively flat, and is designated as a heat-transfer plane 150. The heat-generating elements within the computer enclosure 125 are thermally connected to the heat-transfer plane 150. When the sleeve 110 is placed on the heat-transfer plane 150, with the liquid-filled side 130 in contact with the relatively flat surface of the heat-transfer plane 150, the membrane 130 of the liquid-filled sleeve 130 is able to conform to the contours of the heat-transfer plane 150. When contact is made, the gasket 120 is able to removably seal an enclosure defined by the flat surface 150 of the computer 125, the sleeve 110, and the gasket 120.

When a vacuum is applied to this enclosure, the fluid-filled sleeve 130 inside of the enclosure is sealed to the flat surface 150 by action of the atmospheric pressure. The sleeve 130 is free to deform in order to match the non-ideal flatness of the surface 150. A low thermal resistance is realized between the deformed thin sleeve 130 and the flat surface 150. Thus, a good thermal conduction path is realized between the flat surface 150 of the computer 125 and the thin sleeve 130.

FIG. 1b shows a side view of a computer 125, viewed in cross-section, and where only a few components are displayed: a processor module 128, a few memory chips 127, and a plurality of heat-conducting structures 126 and 175. The heat-conducting structures are lined up close to the flat surface 150 of the computer case 125 or are part of the computer case 125. They carry the heat from the heat-generating devices, including the processor module 128 and the memory chips 127, to the heat-transfer plane 150.

For a high power element such as a processor module 128, the heat conducting structure can be a vapor chamber 175 which provides efficient transfer and spread of heat from the relatively small processor 128 to the relatively wide heat-transfer plane 150. Alternately, heat-pipes (now commonly used in efficient heat-sinks) can be used to couple the processor to the heat-transfer plane 150. For the memory chips 127, heat-pipes or more simple heat conductive structures made out of a good conductive material such as copper or aluminum also provide good thermal conduction between the memory chips 127 and the heat-transfer plane 150.

Referring to FIG. 1c, the computer 125 is shown with the water sleeve 110 attached and filled with water 190 or another suitable liquid coolant. A vacuum is applied between the fluid-filled sleeve 110 and the computer 125, and therefore a good thermal conduction path is realized between the computer components and the liquid coolant 190.

Figure 2:
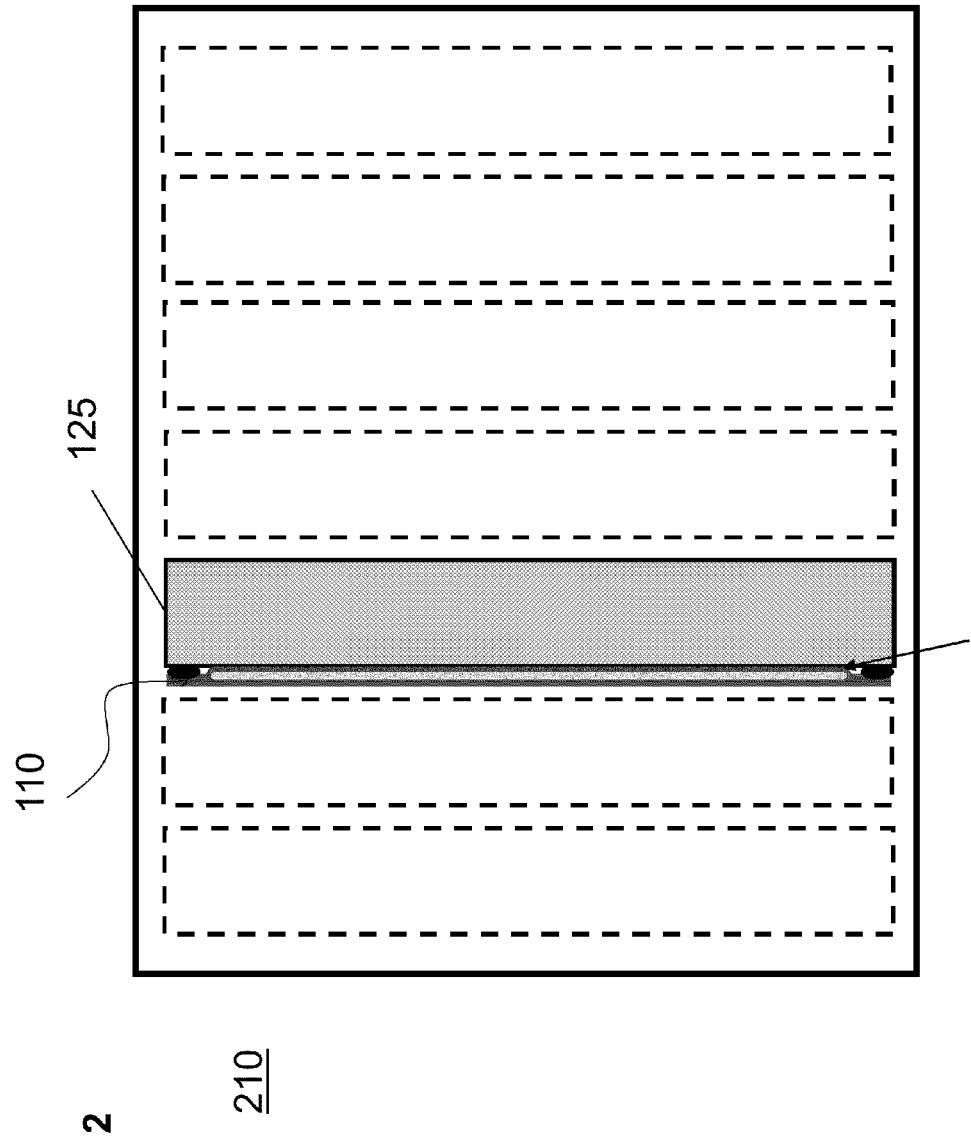
FIG. 2 is an exemplary illustration of a blade server computer, connected to a water sleeve, inside a blade center, according to an embodiment of the present invention.

Referring to FIG. 2, we show an exemplary embodiment wherein the computer 125 is a blade (also called a blade server), which is inserted in a blade center 210 (rack with slots). After the blade server 125 is inserted into the blade center 210, a vacuum is applied between the sleeve 110 and the blade 125. The vacuum serves to establish a good thermal connection between the sleeve 110 and the blade 125. Before removal of the blade 125, the vacuum is first turned off.

Figure 3:
FIG. 3 shows an exemplary heat-transfer plane for a blade server, according to an embodiment of the present invention.

FIG. 3 shows a blade server 125 with a heat-transfer plane 150 having several discrete sections that are connected to two processor vapor chambers, and two heat-conducting structures attached to memory and to other low power chips. Despite having several discrete sections, the heat-transfer plane 150 is made relatively flat and air tight for vacuum connection to a water sleeve 110.

To enhance the thermal conduction between the sleeve 110 and the computer 125, one or both surfaces can be coated with a very thin layer (1 to 10 microns) of a soft conductive material, such as silicone, gel, oil, latex, grease, and other like thermal interface materials that are used in the computer industry. It is preferable to coat the surface of the membrane 130 that will come into contact with the heat transfer plane 150.

FIG. 4a shows a front view of the water sleeve 110 according to an embodiment of the present invention. The water inlet/outlet ports 410 run perpendicular to the sleeve 110; therefore they are shown in cross-section. The gasket seal 120 is also shown surrounding the sleeve 110. FIG. 4b shows a side view of the sleeve 110, indicating the circulation of the liquid 190 in and through the membrane 130, then out through the water port 410. Circulating the liquid 190 serves to enhance the cooling effect provided by the thermal transfer plane. The liquid 190 is circulated by an external water cooling circuit 450 coupled with the sleeve 110 through the ports 410. The circulating liquid 190 carries away the heat generated by the computer 125. The water cooling circuit 450 can include a pump that maintains the fluid in circulation and a cooling device such as a finned radiator with a fan.

Therefore, while there has been described what is presently considered to be the preferred embodiment, it will understood by those skilled in the art that other modifications can be made within the spirit of the invention. The above description of an embodiment is not intended to be exhaustive or limiting in scope. The embodiment, as described, was chosen in order to explain the principles of the invention, show its practical application, and enable those with ordinary skill in the art to understand how to make and use the invention. It should be understood that the invention is not limited to the embodiment described above, but rather should be interpreted within the full meaning and scope of the appended claims.

We claim:

1. A cooling device for cooling an electronic device, said cooling device comprising:
   a flexible and conformal fluid heat-exchanger removably coupled to a surface of the electronic device;
   a liquid coolant material circulated through the fluid heat-exchanger to convey heat from the fluid to an external cooling apparatus;
   an enclosure defined when the fluid heat-exchanger is coupled with the electronic device surface, wherein said enclosure is bounded by the heat-exchanger and electronic device surface; and
   a vacuum applied to the enclosure for removably sealing the fluid heat-exchanger to the electronic device to provide a gas seal for the enclosure, such that applying and removing said vacuum attaches and removes said fluid heat-exchanger.

2. The cooling device of claim 1 wherein the fluid heat-exchanger comprises: a flexible and conformal fluid-cooling sleeve for containing the liquid coolant material, said fluid-cooling sleeve comprising a thin flexible non-permeable membrane, wherein said fluid-cooling sleeve is coupled with the surface of the electronic device.

3. The cooling device of claim 2 wherein the fluid heat-exchanger further comprises at least two ports for introduction and evacuation of the liquid coolant material through the fluid-cooling sleeve, wherein said ports extend from said fluid-cooling sleeve for attachment to the external cooling apparatus.

4. The cooling device of claim 1 further comprising the external cooling apparatus, said cooling apparatus comprising an external fluid pump.

5. The cooling device of claim 2 further comprising a layer of a soft conductive material coating the fluid-cooling sleeve, wherein said layer is between one and ten microns thick.

6. The cooling device of claim 5 wherein the soft conductive material is selected from a group consisting of: silicone, latex, and grease.

7. The cooling device of claim 2 further comprising: at least one gasket around the fluid-cooling sleeve to provide a gas seal between the fluid-cooling sleeve and the electronic device surface when the sleeve is coupled with said electronic device surface.

8. The cooling device of claim 1 wherein the fluid-cooling sleeve is a metallic sheet.

9. The cooling device of claim 1 wherein the metallic sheet comprises a thickness of between 0.1 to 0.5 millimeters.

10. The cooling device of claim 1 wherein the liquid coolant material comprises at least one of water and glycol.

* * * * *